United States Patent [19]

Tatosian et al.

[11] Patent Number: 5,452,418
[45] Date of Patent: Sep. 19, 1995

[54] METHOD OF USING STREAM BUFFER TO PERFORM OPERATION UNDER NORMAL OPERATION MODE AND SELECTIVELY SWITCHING TO TEST MODE TO CHECK DATA INTEGRITY DURING SYSTEM OPERATION

[75] Inventors: David A. Tatosian, Stow; Donald W. Smelser, Bolton; Paul M. Goodwin, Littleton, all of Mass.

[73] Assignee: Digital Equipment Corporation, Maynard, Mass.

[21] Appl. No.: 874,071

[22] Filed: Apr. 24, 1992

[51] Int. Cl.⁶ ..................... G06F 12/16; G06F 13/18
[52] U.S. Cl. ........................... 395/250; 395/444; 371/21.1; 364/971; 364/957.5; 364/964.5; 364/969
[58] Field of Search .............. 395/275, 425, 250, 325; 364/200, 900, 251, 252; 371/21.1, 21.2, 21.3

[56] References Cited

U.S. PATENT DOCUMENTS

| | | | |
|---|---|---|---|
| 4,292,674 | 9/1981 | Scheuneman | 364/200 |
| 4,601,034 | 7/1986 | Sridhar | 371/25 |
| 4,621,320 | 11/1986 | Holste | 364/200 |
| 4,761,731 | 8/1988 | Webb | 364/200 |
| 4,835,738 | 5/1989 | Niehaus et al. | 364/900 |
| 4,951,254 | 8/1990 | Ontrop et al. | 365/201 |
| 5,003,471 | 3/1991 | Gibson | 364/200 |
| 5,133,062 | 7/1992 | Joshi et al. | 395/500 |
| 5,146,578 | 9/1992 | Zangenehpour | 395/425 |
| 5,241,503 | 8/1993 | Cheng | 365/205 |
| 5,261,066 | 11/1993 | Jouppi | 395/425 |
| 5,289,584 | 2/1994 | Thome et al. | 395/325 |
| 5,301,278 | 4/1994 | Bowater et al. | 395/275 |
| 5,337,318 | 8/1994 | Tsukakoshi et al. | 371/5.5 |

Primary Examiner—Thomas C. Lee
Assistant Examiner—Rehana Krick
Attorney, Agent, or Firm—James F. Thompson; Ronald C. Hudgens

[57] ABSTRACT

The operation of a stream buffer varies depending on whether a normal operation mode or a test mode is selected. In the normal operation mode, the stream buffer is read from only when the data requested by a CPU read has been determined to reside there, and the stream buffer location read from is the location determined to contain the requested data. This determination is made by comparing the address of the read request with addresses of the data stored in the stream buffer. Also, the stream buffer is written with memory data in response to a read that misses the stream buffer, and the location written to is one that has been allocated to receive the incoming memory data. Two different buffer allocation methods are shown, first-in-first-out (FIFO) and least-recently-used (LRU). During the test operation mode, the stream buffer is written to and read from directly by the CPU at locations specified in the write and read requests, without regard to the data presence determination and the allocation that take place in the normal operation mode. The method provides a straightforward way of testing the stream buffer during system operation by bypassing some normal functions during test mode in favor of direct stream buffer access by the CPU.

4 Claims, 10 Drawing Sheets

Fig. 9
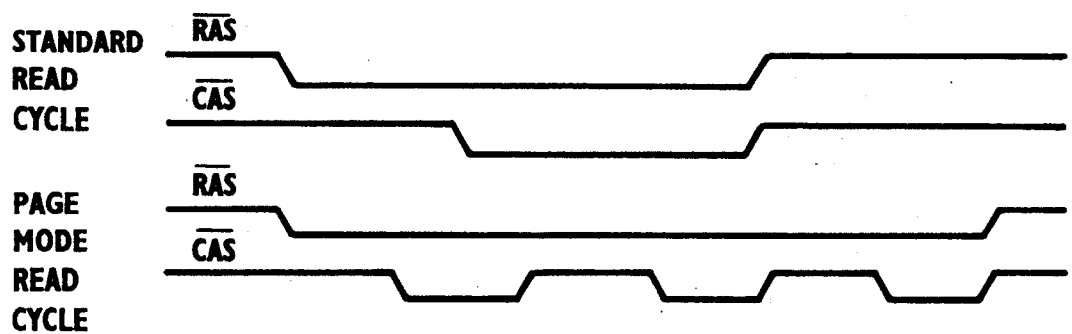
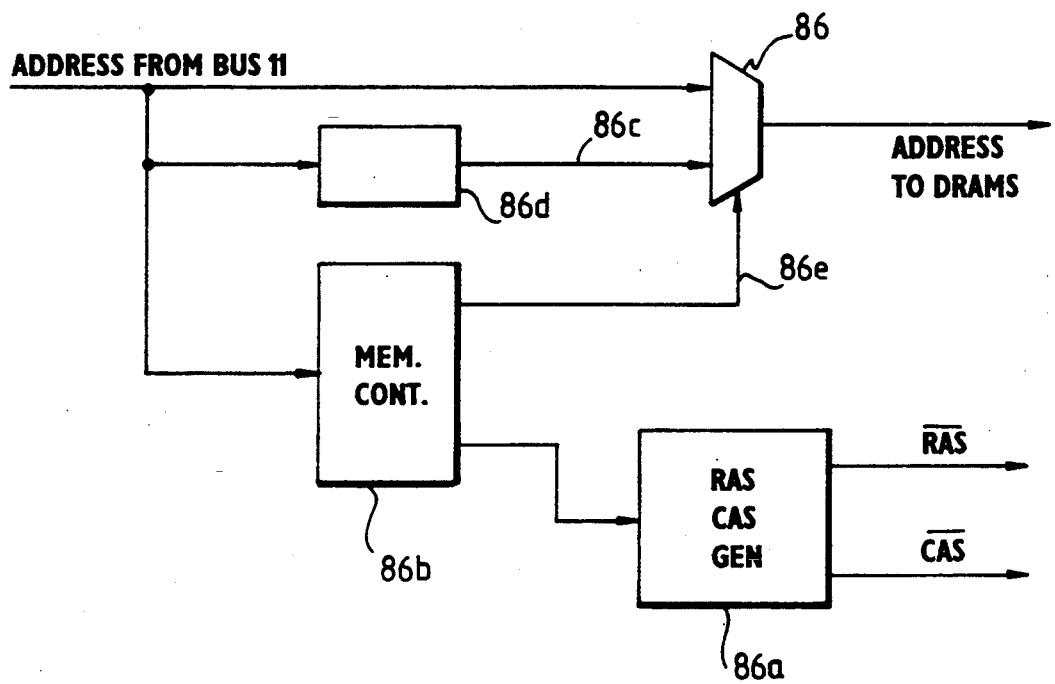
Fig. 10

METHOD OF USING STREAM BUFFER TO PERFORM OPERATION UNDER NORMAL OPERATION MODE AND SELECTIVELY SWITCHING TO TEST MODE TO CHECK DATA INTEGRITY DURING SYSTEM OPERATION

RELATED CASES

This application discloses subject matter also disclosed in the following copending applications, all filed herewith and assigned to the assignee of this application:

Ser. No. 07/874,080, filed Apr. 24, 1992, by Donald Wayne Smelser, David A. Tatosian, and Paul Marshall Goodwin, for "Memory Stream Buffer" now U.S. Pat. No. 5,371,870;

Ser. No. 07/874,077, filed Apr. 24, 1992, by Paul Marshall Goodwin, Donald Wayne Smelser, and David A. Tatosian, for "Stream Buffer Memory Fill Optimization" now pending;

Ser. No. 07/874,076, filed Apr. 24, 1992, by David A. Tatosian, Paul Marshall Goodwin, and Donald Wayne Smelser, for "Memory Stream Buffer with Appended Fill Operation" now pending;

Ser. No. 07/874,074, filed Apr. 24, 1992, by David A. Tatosian, Donald Wayne Smelser, and Paul Marshall Goodwin, for "Stream Buffer with Error Correction and Detection" now abandoned;

Ser. No. 07/874,074, filed Apr. 24, 1992, by Donald Wayne Smelser, Paul Marshall Goodwin, and David A. Tatosian, for "Stream Buffer with Allocation and Invalidate Functions" now pending;

BACKGROUND OF THE INVENTION

This invention relates to memory system for computers, and more particularly to a method for buffering data for sequential read requests in a memory system.

As the speed of processors increases, the need for fast memory systems becomes more important. For example, a high speed RISC processor of the type disclosed in copending application Ser. No. 547,630, filed Jun. 29, 1990 now pending, assigned to Digital Equipment Corporation, may be constructed to operate at a CPU cycle time of 5-nsec or less, and execute an instruction during each cycle (due to the RISC concepts implemented). If the main memory (usually composed of DRAMs) has a cycle time of 300-nsec, for example, it can be calculated that the CPU could spend much of its time waiting for memory, even using a cache with typical cache hit rates. In efforts to bring the memory performance more in line with the CPU, the cache memory is made hierarchical, providing primary, secondary, and, in some cases, third level caches, and of course the speed of the cache memories is increased as much as is economical. In addition, the bandwidth of the memory bus is increased, as by using a wider data path. Nevertheless, efforts are still needed to reduce the amount of time the CPU spends waiting on memory, to achieve acceptable performance for these high-speed CPUs.

When caching is employed, read accesses to main memory are most often for fetching an entire cache line, and it is preferable to make the memory data path equal to the width of a cache line or a submultiple of a cache line. The principal of locality suggests that cache lines will often be accessed in sequence, and, when two sequential cache lines are accessed, there is a reasonable probability that the sequence will be continued. One of the features of this invention is to take advantage of this observation in order to increase system performance.

In constructing main memory for typical computers, the most widely used device is the MOS DRAM or dynamic RAM. These devices have access times of perhaps 70-ns, but cycle times are much longer, perhaps 200-ns or more. However, most DRAMs now commercially available have a feature called "page mode" in which the column address can be changed after a row access to the DRAM array, producing a sequence of data outputs at a faster rate, so long as the new column addresses are in the same "page." To invoke page mode operation, the row address strobe or RAS signal applied to the DRAM is held in the asserted condition, and the column address strobe or CAS is toggled; a new column address is asserted each time CAS is reasserted. This mode of operation is about twice as fast as standard RAS-CAS reads, so if this mode can be advantageously employed, then the average access time can be reduced.

The advantages obtained by use of various features of the invention include providing faster access to sequential data located in memory modules installed on a multi-node memory bus. By taking advantage of the fast page mode capabilities of dynamic random access memory (DRAM) devices, the method of the invention allows for detection of sequential memory access, and, in response, prefetches memory data from the next sequential location in advance of the actual request for that data by the host computing system, placing the data in a high-speed memory device. As a result, when the host computing system requests the next piece of memory data (usually a cache line), the data can be delivered to the host computing system much faster than if the data had to be delivered directly from the DRAMs of the memory module.

An important feature of one embodiment is the actual location of the stream buffer on the memory module itself, rather than upstream. By placing the stream buffer memory on the memory module, filling the stream buffers can be done without utilizing the system bus (shared with other resources), thereby conserving system memory interconnect bandwidth and throughput. Also, filling the stream buffers can be done using the fast page mode operation of the DRAM devices, a significant performance advantage. Finally, by placing the stream buffer memory within the logic domain covered by the memory module error detection and correction logic, the reliability, availability, and data integrity is enhanced.

SUMMARY OF THE INVENTION

In accordance with one embodiment of the invention, a read buffering system employs a bank of FIFOs to hold sequential read data for a number of data streams being fetched by a computer. The FIFOs are located in the memory controller, so the system bus is not used in the memory accesses needed to fill the stream buffer. The buffer system stores addresses used for read requests made by a CPU, and if a next sequential address is then detected in a subsequent read request, this is designated to be a stream (i.e., sequential reads). When a stream is thus detected, data is fetched from DRAM memory for addresses following the sequential address, and this prefetched data is stored in one of the FIFOs. A FIFO is selected using a least-recently-used algorithm. When the CPU subsequently makes a read request for data in a FIFO, this data can be returned without making a memory access, and so the access time seen by the CPU is shorter. By taking advantage of page mode, access to the DRAM memory for the prefetch operations can be transparent to the CPU, resulting in substantial performance improvement if sequential accesses are frequent. One feature is appending page mode read cycles to a normal read, in order to fill the FIFO. The data is stored in the DRAMs with ECC check bits, and error detection and correction (EDC) is performed on the read data downstream of the stream buffer, so the data in the stream buffer is protected by EDC.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings, wherein:

FIG. 9 is a timing diagram of events vs. time for a DRAM implementing a page mode operation;

FIG. 10 is an electrical diagram in block form of the memory control for generating appended fill cycles, used in the module of FIG. 3, according to one embodiment.

DETAILED DESCRIPTION OF SPECIFIC EMBODIMENT

Figure 1:
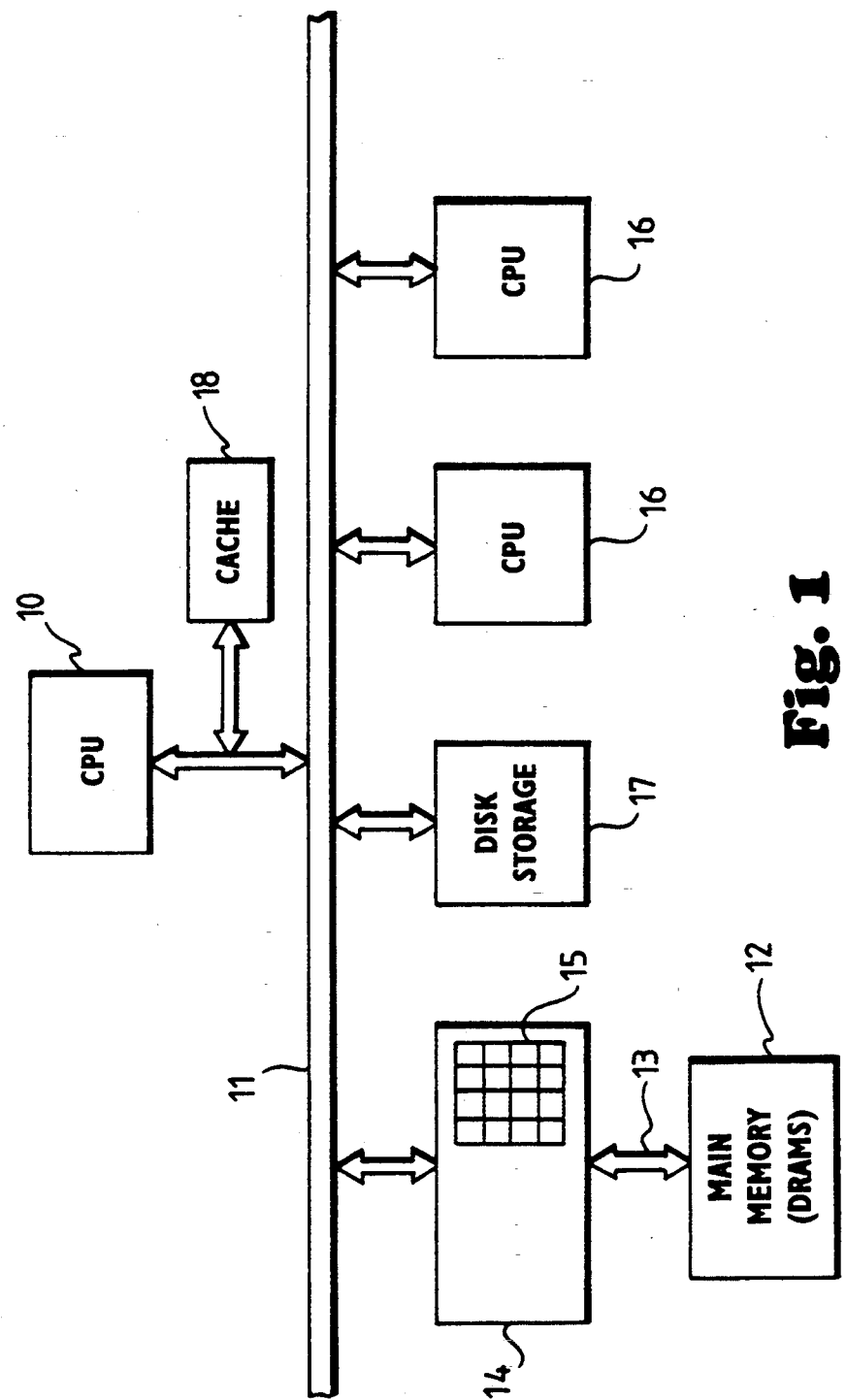
FIG. 1 is a diagram of a computer system which may employ features of one embodiment of the invention.

Referring to FIG. 1, a computer system is illustrated which may use a stream buffer having features of the invention. A CPU 10 is connected to a system bus 11 for access to various system resources. The CPU may be, for example, of the VAX TM architecture as described by Levy and Eckhouse in "Computer Programming and Architecture: The VAX", 2nd Ed., Digital Press, 1989. A single-chip CPU of the VAX architecture is disclosed in U.S. Pat. No. 5,006,980, issued to Sander, Uhler & Brown, assigned to Digital Equipment Corporation, the assignee of this invention. The CPU 10 also may be of an advanced 64-bit RISC architecture as disclosed in my copending application Ser. No. 547,630, filed Jun. 29, 1990, now pending, also assigned to Digital Equipment Corporation. Alternatively, of course, the CPU may be of many other types, such as the Intel 386 or 486 architecture, or MIPS R3000 or R4000 RISC architecture. The system bus 11 may be any of the standard bus specifications used for any of the many commonly-used CPUs, but in an example embodiment is a VAX bus.

A main memory 12 is connected to the system bus 11 by a memory bus 13 and a memory interface or control 14 containing the stream buffer 15 according to features of the invention. The purpose of the stream buffer 15 is to hold read data prefetched from addresses following a sequential read access received from the CPU 10. That is, when a read request for a given address X is received by the control 14 from the CPU 10 on the system bus 11, this address X is stored to see if a read for the next sequential location (cache line) X+1 is soon requested. If so, the response is to fetch the data at address X+1 from the memory 12 and send it back to the CPU 10 on the system bus, then to fetch sequential data at addresses X+2, X+3, etc., and store this data in the stream buffer 15. The principle of locality suggests that the CPU will send memory requests for the sequential locations X+2, X+3, etc., and when this happens, the access time in responding to these subsequent requests is much shorter when the data is in the buffer 15 than when a read access to memory 12 must be made. The bus cycle for the system bus 11, and the way the CPU 10 operates, are such that the time between read requests from the CPU for sequential data will be sufficient to allow for memory cycles on the memory bus 13 (particularly, page mode accesses) to be executed to fill the buffer 15 with the desired data stream, before the CPU makes the memory requests. The stream buffer 15 is large enough to hold a number of data steams, for example, four streams. Thus, read accesses for data and instructions may be in different pages, and more than one task may be executing on the CPU 10, so several streams may be working simultaneously; four of these can be accommodated in the stream buffer 15 of the example embodiment. The stream buffer 15 is constructed as a set of four FIFOs, with four entries for each FIFO, as will be explained.

In addition to the CPU 10, other CPUs 16 as seen in FIG. 1 may be accessing the memory 12 by the system bus 11 in a multiprocessor system, so there may be streams resident in the stream buffer 15 for more than one processor, as well as more than one process. Various other system resources such as a disk storage facility 17 are usually connected to the system bus 11.

Memory references made by the CPU 10 to the memory 12 are for a cache line, which in typical embodiments is 128-bits or 256-bits, rather than for a word. A cache 18 holds a subset of data from memory 12, and is accessed in a much shorter cycle than an access to memory 12. A large percentage of the memory requests made by the CPU 10 result in cache hits (perhaps 90% or more) and so require no transaction on the bus 11. When a cache miss occurs, however, the data from the requested location in memory 12 is fetched via the bus 11, and the entire cache line containing this memory location (even if the request is for only a 32-bit word) is fetched from memory and used to fill a line of the cache 18. Memory references are therefore on even cache line boundaries, and so when "incrementing by +1" is referred to herein it is understood that the addresses are incremented by +16 byte addresses or +32 byte addresses, or whatever the configuration requires. The address sent out on the bus 11 from the CPU is truncated since some low-order bits of the internal CPU are never needed in addressing the memory 12. The cache 18 may be internal to the microprocessor chip which implements the CPU 10, or external; more often, a combination of on-chip (first-level) and external (secondary or back-up) caches are used. In a particular embodiment, the cache 18 is direct-mapped, meaning that only one cache location is available for a given index number, i.e., all memory references having the same index will map to the same location in the cache. This is material to the address transposing mentioned below in reference to exchange transactions.

Figure 2:
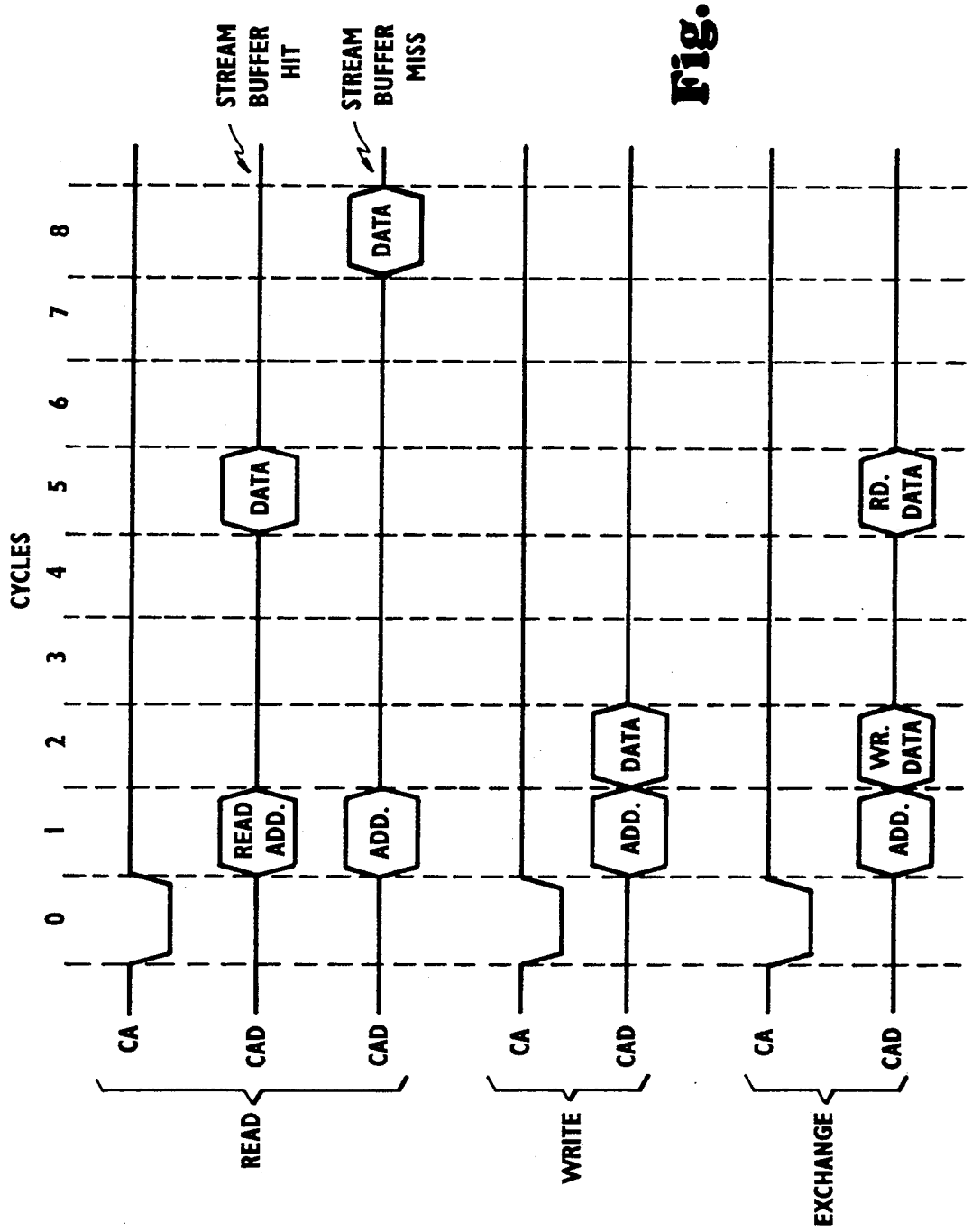
FIG. 2 is a timing diagram showing events vs. time for bus cycles in the system of FIG. 1.

In a particular embodiment, the bus 11 is a multiplexed command/address/data bus on which memory requests are sent by the CPU 10 in the manner illustrated in FIG. 2. A memory request is initiated in cycle-0 by a command strobe CA, an output from the CPU. In cycle-1, the bus 11 is driven by commands and address bits labelled CAD (command/address/data) in FIG. 2, in the first example representing a read request. If the requested data is in the stream buffer 15, the data is returned to the bus 11 in cycle-5, but if the requested data is not in the stream buffer the data is returned to bus 11 in cycle-8. The difference of three cycles represents the delay in accessing the memory 12, compared to getting the data directly from the stream buffer 15. A write cycle as illustrated in FIG. 1 is initiated by a CA strobe as before, and the write address and write command is asserted on bus 11 by the CPU in cycle-1, followed immediately by the write data in cycle-2. The delay before another memory transaction can begin on the bus 11 following a write depends upon whether the write can be made to a write buffer (not shown) or must be sent to memory 12.

The memory 12, in one embodiment, supports a so-called "exchange" transaction, which consists of both a write and a read in one bus transaction. This is ordinarily used to write back a cache line from the cache 18 to memory 12 and to read a cache line; this can be done, of course, only if the addresses are appropriate, since only one cycle of address information is sent. In FIG. 2, an exchange command begins in cycle-0 with a CA strobe, the address and command is asserted by the CPU 10 on the bus 11 in cycle-1, and the write data is asserted on the bus 11 by the CPU in cycle-2. If the write can be done to a write buffer, and the read data is in the fill buffer 15, it is returned on bus 11 in cycle-5, or if an access to memory 12 for the read is needed then read data is returned in cycle-8. An exchange transaction is an atomic operation that swaps one cache line from the cache 18 with another line read from memory 12 (or from buffer 15). This operation is used to enhance performance of the memory system when filling a cache location in the instance of a cache miss to a "dirty" cache line (one that has been written to). An exchange transaction uses the address fields sent in cycle-1 to send the unique cache tag address for the location in memory to write back the dirty cache line, and also the cache tag for the cache line to be loaded into the cache 18. In addition, a single cache index field is sent for an exchange transaction. Thus, two cache tag addresses (16-bits each) and one index (13-bits) are sent on bus 11 in cycle-2. Note that the same index is used for both the write back and the cache fill data, so the address bits must be appropriate.

Figure 3:
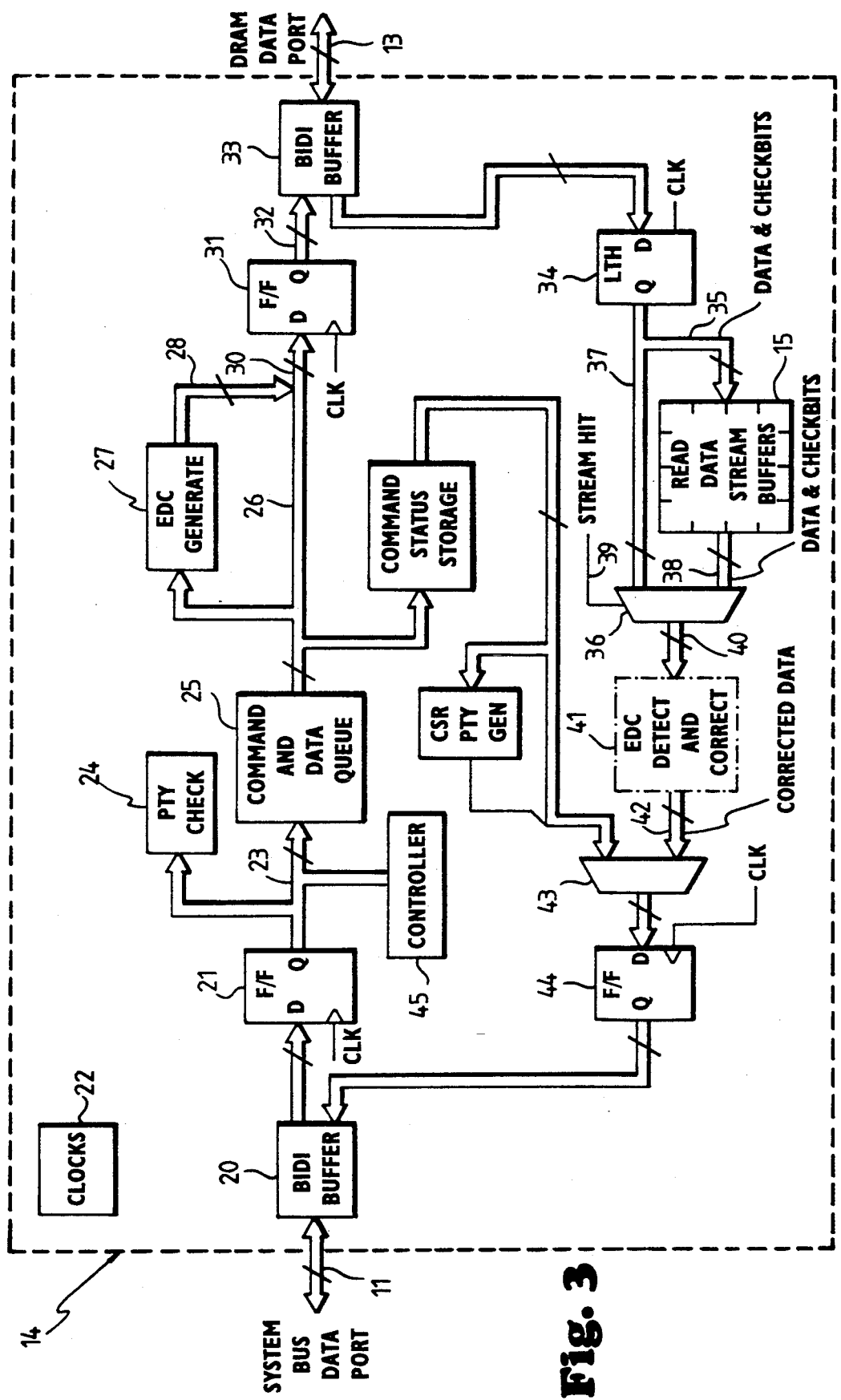
FIG. 3 is an electrical diagram in block form of a memory control used in the system of FIG. 1 and employing features of the invention.

Referring to FIG. 3, the control module 14 is shown in more detail. The control module of course handles write data as well as read data, and write data moves from left to right at the upper part of the Figure, from system bus 11 to memory bus 13. Read data, on the other hand, moves from right to left at the lower part of FIG. 3, from memory bus 13 to system bus 11. The stream buffer 15 is in the read data path. A bidirectional bus interface 20 accepts data and commands (read and write requests, including addresses, as in FIG. 2) from the system bus 11, and applies the received information to a latch 21 clocked by a local clock source 22. The output from the latch 21 is applied by lines 23 to a parity check circuit 24; if parity does not check then a fault is signalled. The information on lines 23 is also applied to a command and data queue 25. A read request is held for execution, with just the address and commands being sent to the memory 12 (if access to memory 12 is needed) under control of the controller, but a write request has data to be sent on to memory 12. Output from the command and data queue on lines 26 for a write request is applied to an ECC generator circuit 27 where ECC bits are calculated and output on lines 28. The ECC bits on output 28 are added to the data on lines 26, producing a full data word including ECC bits on lines 30. If the data width at the output lines 26 is 128-bits, for example, then the ECC circuit 27 may generate a 12-bit ECC field on lines 28, so the total width of the output on lines 30 is 140-bits. The latch 31 provides an output 32 to a bidirectional bus interface 33 which interfaces with the memory bus 13.

When a read request requiring an access to memory 12 is being executed, the read data path receives data from the memory bus 13 via bidirectional interface 33 and clocked latch 34. The read data can be applied to the stream buffer 15 by lines 35, or can be applied directly to a multiplexer 36 by lines 37 to bypass the stream buffer. In executing a read request where the data requested is not in the buffer 15, the read data returned to the unit 14 from the memory 12 is sent directly back toward the CPU by the path 37 rather than being stored in the buffer 15. If requested data is in the buffer 15, however, it is applied to the multiplexer 36 by lines 38, without needing a memory access to DRAMs 12. Selection of which input lines 37 or 38 are used as the output of the multiplexer 36 is made by a stream hit input 39. The output 40 of the multiplexer 36 is applied to an error detection and correction (EDC) circuit 41. The circuit 41 accepts the 140-bit wide data input on lines 40 and uses the 12-bit ECC field to determine if the 128-bit data field is correct, and toggles incorrect bits if found. If more than two bits are incorrect, a fault is signaled and the data is not corrected. The output 42 of the EDC circuit 41 is 128-bits wide and is applied to a multiplexer 43 for coupling back through a clocked latch 44 to the bus interface 20, from which read data is sent back to the CPU 10 via system bus 11. A controller 45 receives commands loaded to the memory control 14 from the CPU 10 via bus 11, and generates the hit signals and various control signals for the stream buffer, as will be described.

Figure 4:
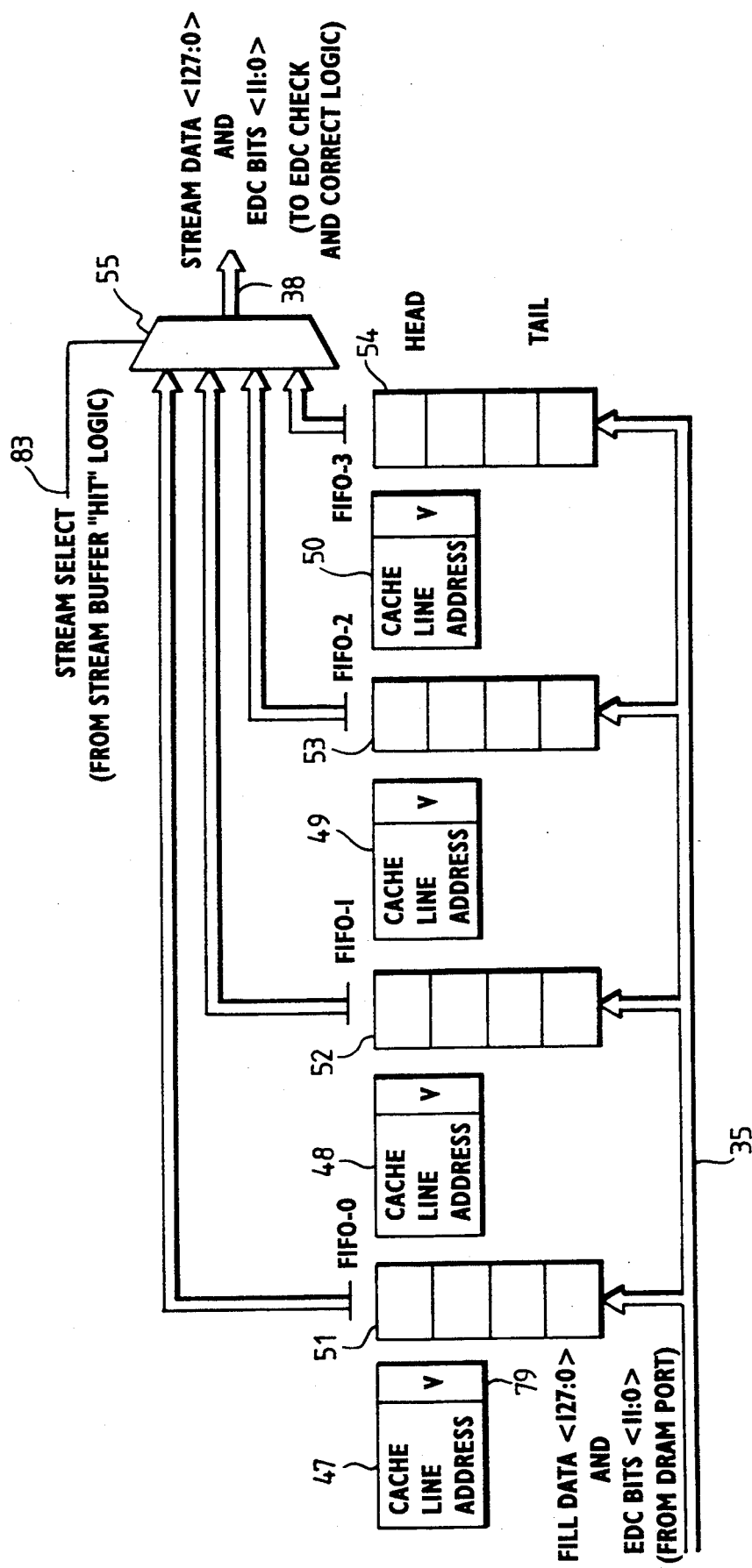
FIG. 4 is an electrical diagram in block form of stream buffer FIFO logic used in the controller of FIG. 3, according to one embodiment.

Referring to FIG. 4, the stream buffer 15 is configured in the example embodiment as four FIFOs 51, 52, 53 and 54. Each of the FIFOs holds up to four data blocks, with each data block containing 128-bits of data plus the 12-bit EDC check bit field, as seen in the Figure. Each FIFO has an associated head address register, shown in FIG. 4 as 47, 48, 49 and 50, that maintain the effective cache line address of the data currently held in the head of the corresponding FIFO. In addition to holding the cache line address, each of the head address registers provides a valid bit which indicates whether the corresponding FIFO has valid data at its head location. The four FIFOs rely on a single control mechanism to perform the loading of read data form the DRAMs of memory 12 via lines 35 into the tail of the FIFO, and the subsequent extraction of read data from the head of the FIFO for delivery via output 38 to the system bus 11. A multiplexer 55 selects one of the four 140-bit outputs 56 from the FIFOs to apply to the lines 38 when a stream buffer hit is detected.

Figure 5:
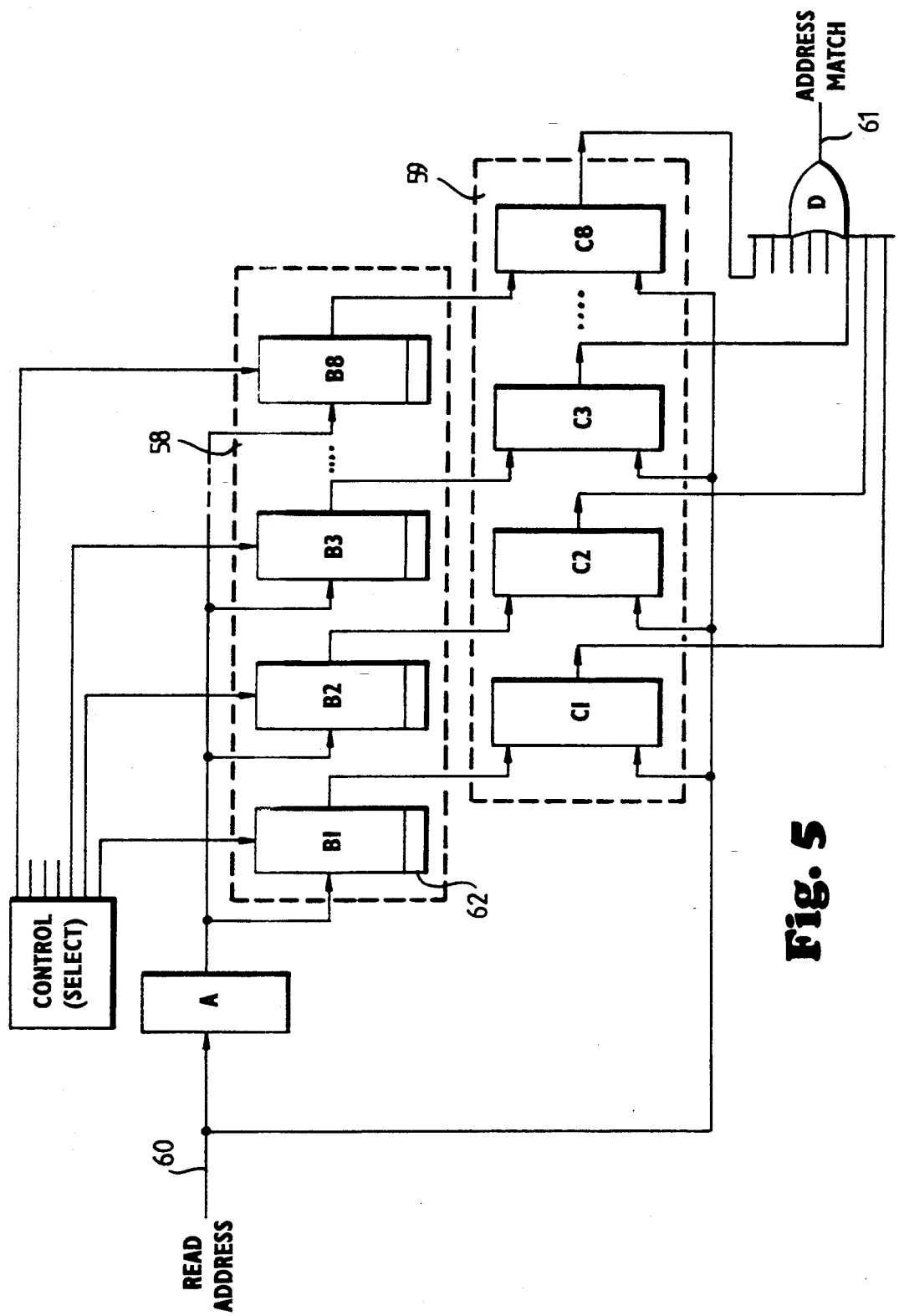
FIG. 5 is an electrical diagram in block form of stream detection logic used in the controller of FIG. 3, according to one embodiment.

The stream detection logic of FIG. 5 is part of the controller 45 and is used to determine when a CPU 10 is in the process of reading contiguous locations in memory 12, which is the situation where the beneficial effects offered by the prefetching of data can be utilized. The intent of the detection logic is to anticipate the subsequent need for data from memory 12, prior to the actual read command arriving in unit 14 requesting that data. The stream detection logic, in essence, simply keeps a record of the addresses in memory 12 of the previous eight read transactions. This record is kept in a history buffer cache 58, which has eight locations B1-B8; the first location B1 is loaded from the incoming read cache line address through an adder A which adds 1 to the incoming read cache line address (i.e., incrementing) prior to loading into location B1, and when the next read request is received the corresponding cache line address is incremented by adder A before being loaded into location B2, and likewise each subsequent read address received from CPU 10 is incremented and loaded into the next location, proceeding through location B8, whereupon the ninth read request has its cache line address incremented and loaded into location B1, thus overwriting the previous contents of that element. In this manner the eight locations within the history buffer cache are used in a true round robin basis, such that at any given time the history buffer contains the cache line addresses of the last eight read requests. Comparators 59, connected to receive the incoming read address on line 60 and the output of one of the locations of B1, B2, etc., of the history buffer 58, compare each subsequent read transaction address from latch 21 of FIG. 3 to see if the new address of an incoming read request is contiguous to any of the recorded addresses held in the history buffer. (If cache line addresses, on even 256-bit boundaries, are sent on bus 11, then "contiguous" means X+1). If the new address is determined to be "contiguous" to any one of the previous eight addresses in the history buffer cache 58, a new "read stream" is "declared" by the address match signal on line 61. This results in one of the stream buffers 51-54 being allocated to this new stream, to be used to store data from the memory 12 to be "prefetched" by the controller logic.

Each location B1-B8 within the history buffer cache 58 also maintains a single status bit 62, which is referred to as the valid bit. Each valid bit is set whenever a new read address is loaded into the corresponding history buffer location B1-B8. Each valid bit indicates whether the contents of the corresponding location B1-B8 was loaded during normal system operation, and therefore protects against spurious operation as a result of initialization after the system is powered up. If the valid bit 62 is not set in a history buffer location, that location is prevented from making a successful compare against any new address, and therefore cannot cause a stream to be detected.

The re-detection of existing streams is prevented by first calculating the effective array address from the new address on bus 11, and then comparing that to the entries already contained within the head address registers 47-50 for the four stream buffer FIFOs 51-54. That same address generation logic used by the fill logic can be used for this purpose. If the head of any of * the stream buffer FIFOs 51-54 has an entry that corresponds to the effective array address, the "existing-stream" signal will inhibit the creation of a new stream.

The history buffer and stream detection logic circuitry is illustrated in FIG. 5, for one embodiment of the invention. This circuitry is shared by all the stream buffers, i.e., only one copy of the stream detection logic is required.

Figure 6:
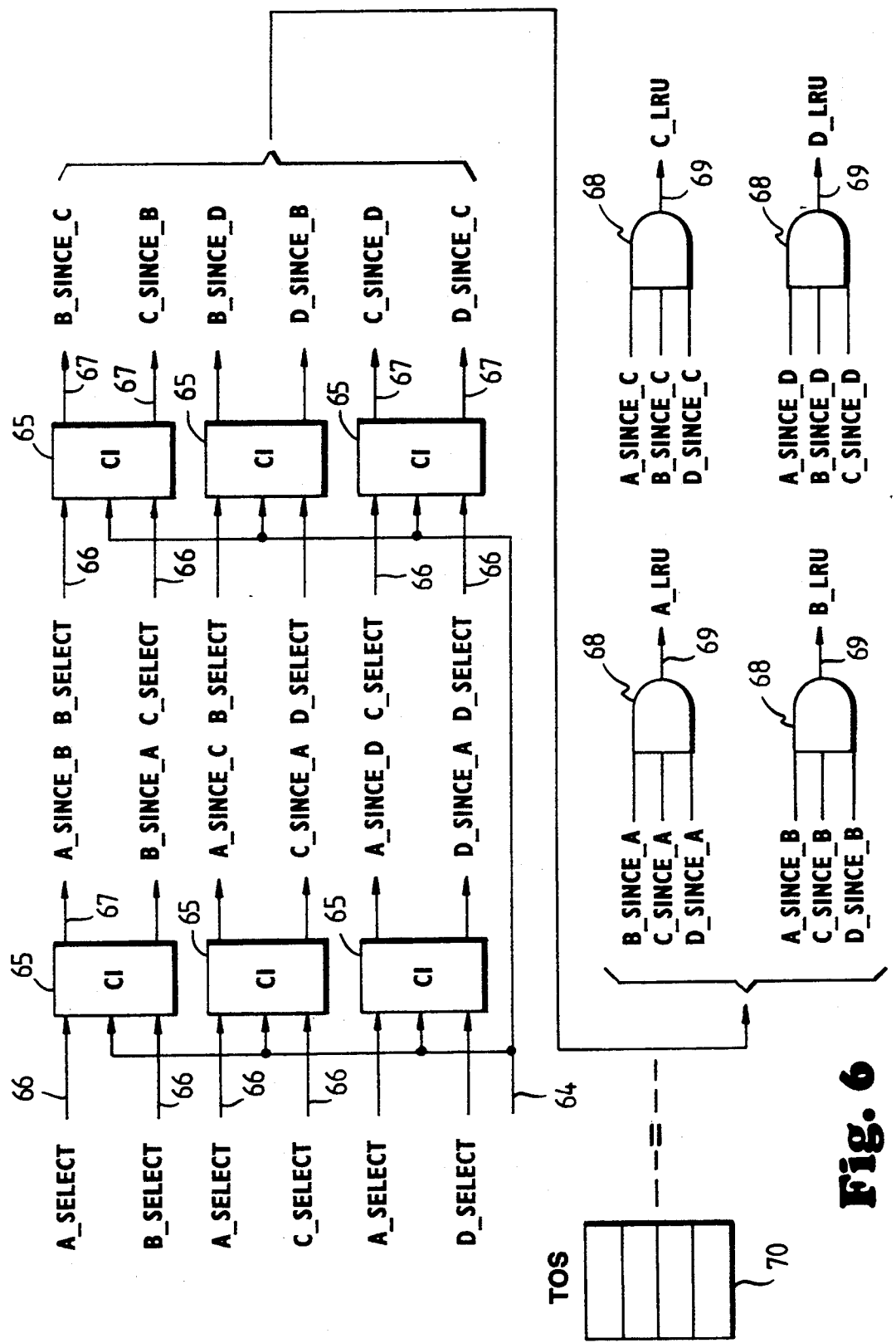
FIG. 6 is an electrical diagram in block form of stream buffer allocation circuit used in the controller of FIG. 3, according to one embodiment.

The stream buffers 15 are allocated on a modified least-recently-used (LRU) basis, as managed by the stream buffer allocation circuitry shown in FIG. 6; this circuitry is also part of the controller 45. The allocation circuitry is shared by all the stream buffers, i.e., only one copy of this allocation logic is required. This circuitry assures that the stream buffers are utilized in the most efficient manner. When a buffer hit is signalled on line 83 by the circuitry of FIG. 8, an input 64 to a set of six J-K flip-flops 65 causes the A-sel, B-sel, C-sel, etc., inputs 66 to be evaluated, and outputs 67 are valid until the next hit. These outputs 67 indicate for each pair of the four buffers 51-54 which one was more recent. The outputs 67 are applied as inputs to a set of four AND gates 68, producing outputs 69 in the controller 45 indicating which one of the four buffers 51-54 is LRU. When a buffer is selected at the next hit, it will thus be the one indicated by the one output 69 that is asserted. This one output 69 is then deasserted, and the next LRU is asserted (one of the other outputs 69 is asserted). In effect, the logic provides a stack 70 of four buffer identities to indicate the relative time between successful hits on each of the four buffers 51-54. When a buffer 51-54 is allocated upon the event of a hit, the identity of that buffer is placed on the bottom of the stack 70, pushing the other buffer identities up the stack (i.e., as indicated by the order the outputs 69 will be asserted). As time progresses, memory read transactions that hit on the contents of a buffer 51-54 push the corresponding buffer identity to the bottom of the stack 70. The buffer identity on the top of the stack is always the LRU buffer, and would therefore be the next buffer to be allocated when the next new read stream is detected. In the event that a stream buffer 51-54 is invalidated as discussed below, the identity of that buffer is placed immediately at the top of the stack 70, and therefore this buffer will be the next buffer to be allocated when the next read stream is detected.

Figure 7:
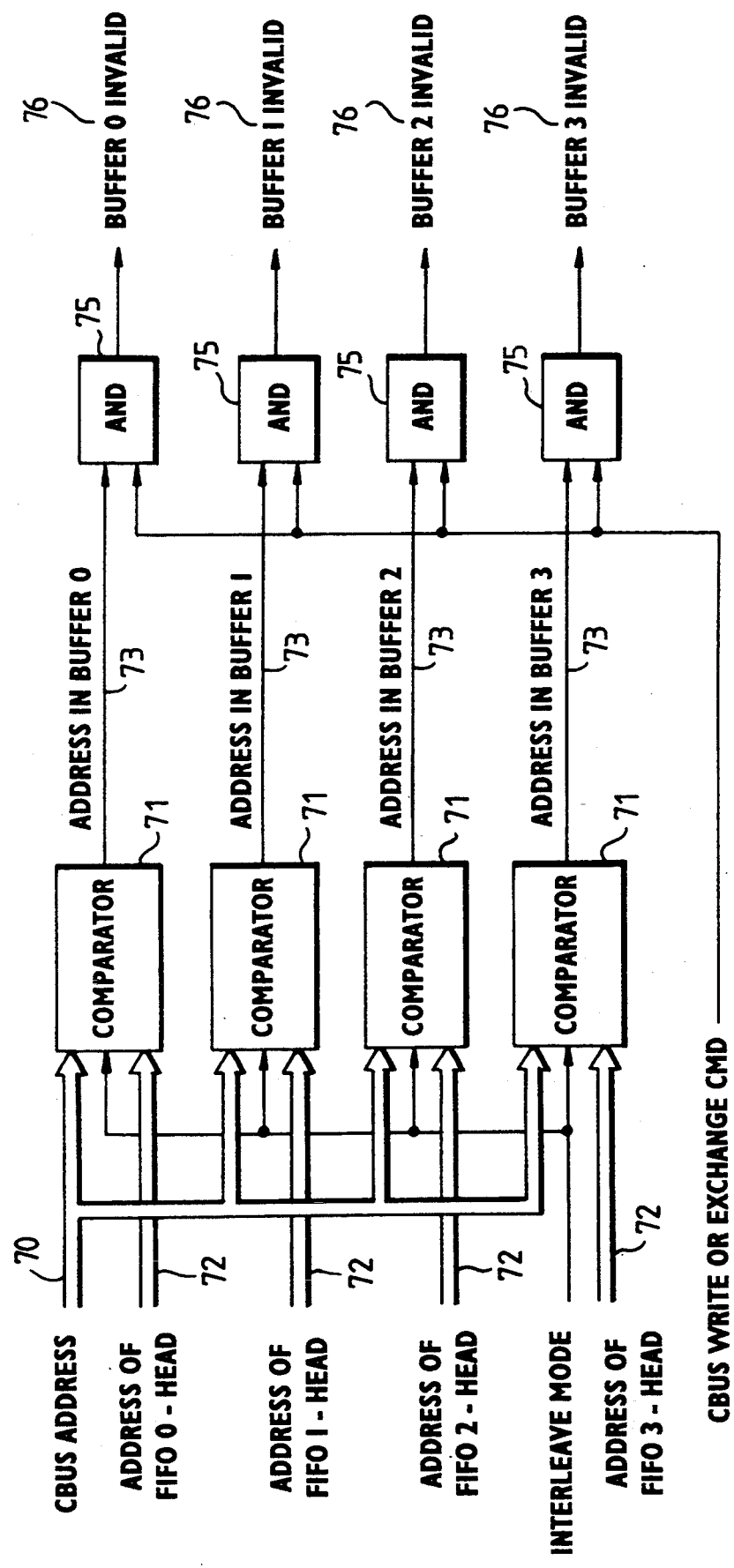
FIG. 7 is an electrical diagram in block form of stream buffer invalidate circuit used in the controller of FIG. 3, according to one embodiment.

Referring to FIG. 7, the stream buffer invalidate circuit is shown in detail. Data in the stream buffer 15 can become "stale" when a write-to-memory operation occurs for a memory location contained in the buffer 15. In order to assure that the read data residing in a stream buffer 51-54 is always "coherent", all system memory write transactions are checked to see whether an address of the write operation appearing on the bus 11 coincides with an existing stream buffer 51-54 entry. Each write transaction address on input 70 from the bus 11 (e.g., from latch 21) is compared in four compare circuits 71 with inputs 72 from the four stream buffer head address register entries 47-50, producing four comparison outputs 73; these outputs 73 are each ANDed with a write command signal from the bus 11 in gates 75, producing a "buffer invalid" output 76 for each of the four stream buffers; this output 76 is used to toggle the valid bit 79 for the corresponding buffer location. If a write transaction address on input 70 from the bus 11 is equal to any address potentially residing in a stream buffer, that entire stream is declared invalid, thus preventing any of the data in that stream buffer from being erroneously supplied to CPU 10. Once a stream buffer is invalidated it is available to be reallocated to the next detected read stream.

In addition to the invalidation of individual streams (individual buffers 51-54) due to memory write or memory exchange commands, all four stream buffers 51-54 are invalidated at any time the memory configuration control register is written, and at any time that a command parity error is detected. In the case of rewriting the configuration register, re-configuration of the memory module address or interleaving assignments makes the address relationship of the contents of the stream buffers 51-54 incoherent, while in the case of command parity error the failed transaction may have been a write or exchange to a memory location whose data is currently resident in a stream buffer entry, and which under normal conditions (i.e. no command parity error) would have resulted in an invalidation of the appropriate stream buffer. These functions protect against the possible reading of "stale" or incoherent data.

Figure 8:
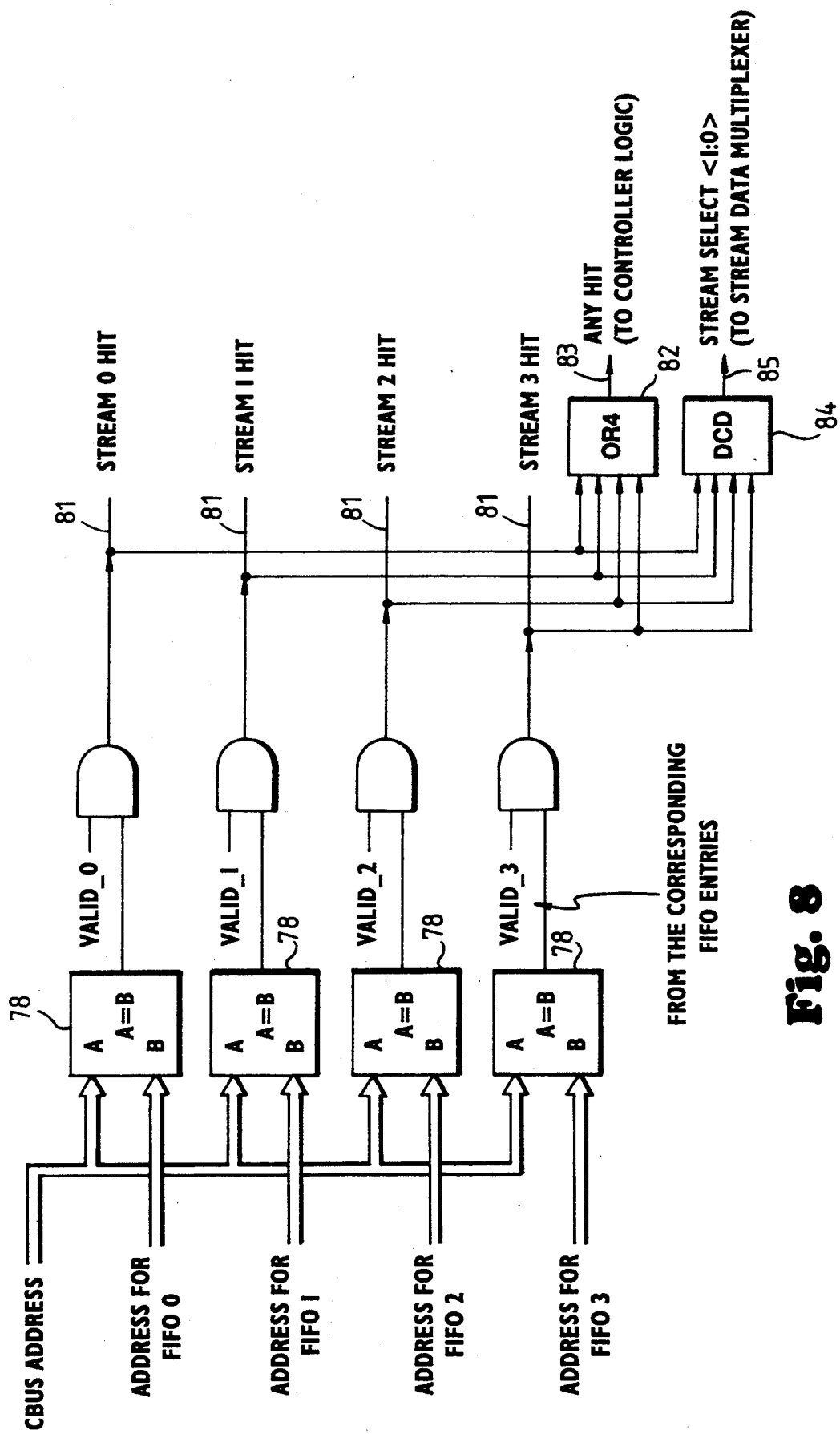
FIG. 8 is an electrical diagram in block form of stream buffer hit logic circuit used in the controller of FIG. 3, according to one embodiment.

Once a stream buffer 51-54 has been allocated and some amount of prefetched data has been placed in the FIFO, the stream buffer hit logic of FIG. 8 compares incoming read or exchange command addresses to detect a comparison between the requested address and the address of the data at the head of each stream buffer FIFO entry. If a compare of these two addresses is successful, read data may be delivered directly from the stream buffer 51-54 to the system bus 11, without performing a (much slower) access to the DRAMs of memory 12. Read latency should be reduced to the minimum architected read transaction delay (i.e., "zero stall states") of seven system bus cycles (for an example embodiment) upon a successful hit on a stream buffer.

The circuitry of the hit logic of FIG. 8 shows the logic supporting "hit" detection for one embodiment. As there are four stream buffers 51-54, four comparisons are performed in parallel in the comparators 78. The outputs of the comparators 78 are gated by the state of their respective valid bits 79 which exist within each of the stream head address register entries 47-50. If any of the resultant hit signals on lines 81 become asserted during a read (or exchange) operation, an OR gate 82 produces a "hit" signal on line 83 to inform the memory control and system bus control logic which will supply the appropriate sequencing of the memory 12 to account for shorter read latency, and will inhibit DRAM accessing of the memory 12. Additionally, the four hit signals on lines 81 are combined in a coder circuit 84 to generate a 2-bit stream select on lines 85. The stream select is used to gate the correct FIFO data through a 4:1 multiplexer 55 to the lines 38 on the way to the system bus 11.

The stream buffer of the invention is particularly suitable for use with DRAM memory devices implementing page mode. A DRAM device of the type commercially available in 1-Mbyte and 4-Mbyte sizes has a row length of say, 512, 1024 or 2048 cells (depending upon layout of the chip), and when a read access is made using a row address and RAS, any of the columns of this row may then be accessed (without asserting a new row access) by merely toggling CAS and asserting a new column address, as illustrated in FIG. 9. The page mode access time is much shorter than RAS-CAS access time.

When either a new read stream is detected, or a continuing read stream causes a stream buffer 51-54 to transition to an "empty" condition, the stream buffer fill circuit in controller 14 will fetch data from the appropriate DRAM address in memory 12 and place it into the desired stream buffer FIFO 51-54. The stream buffer logic generates the correct DRAM address from the incoming memory address, complete with appropriate incrementing, while accounting for interleaved configurations and the effect on the availability of page mode accesses of the DRAMs of the memory 12.

In Tables 1 and 2 the address bits used to address the memory 12 are shown in the left-hand column (called Logical Signal); these include row address bits 0-9 and column address bits 0-9 (called RW Col Bits or read/write column bits) plus read/write bank select bits 0-1 and board select bits 0-8. For exchange operations, a different combination is used for the column address, bank select and board select as shown. In the six right-hand columns the address bits of the bus 11 (CAD or command/address/data bits) are shown. Note that there is a gap between CAD bits <31> and <64> because in the example embodiment the memory system is implemented in two slices, using a 128-bit bus 11. The command/address/data for each half is sent separately on the bus 11, using bits <31:0> and <95:64> for one half and bits <63:32> and <127:96> for the other. Thus the tables 1 and 2 represent the address bits on bus 11 for one half, and corresponding numbers would be used for the other half.

A memory system can be constructed using 1-M, 4-M, or 16-M DRAM devices, for example, and the boards laid out to provide one-way, two-way or four-way interleaving. In an example embodiment, "by-4" DRAM devices are used. Two or four banks of DRAMs may be used in the configuration, using the address transposition set forth in Tables 1 and 2. This provides a memory size for the memory 12 of 16-Mbyte or 32-Mbyte if 1-Mbit DRams are used, or 64-Mbyte or 128-Mbyte if 4-Mbit DRAMs are used.

The principle used in selecting the address bit transposition in Tables 1 and 2 is that the row address bits going to the DRAMs in memory 12 are a subset of the index address (i.e., tag bits aren't used as row address bits).

Referring to Table 1 and Table 2 it can be seen that when the memory is configured under one-way interleaving, the two least significant column address bits correspond to the two memory bus address (bus 11) least significant bits, and therefore the array module is capable of performing up to four page mode read cycles. This means that, once a DRAM address is established when filling a steam buffer entry, successive page mode reads can be preformed, filling multiple locations in the steam buffer, at substantially higher performance than if a corresponding number of entries were to be filled using a full RAS-CAS read cycle for each entry.

From Table 1 and Table 2, it can be also seen that if the array module is configured under two-way interleaving, the memory bus LSB becomes part of the board select field, leaving only the next higher LSB for use as the column address LSB. Therefore, a maximum of two page mode cycles may be performed under this configuration for the purpose of quickly filling a stream buffer. Further, if the memory module is configured under four-way interleaving, neither of the memory bus address LSBs correspond to the column address LSBs, and therefore no page mode read operations are possible, Any filling of a stream buffer in this case must be done as individual RAS-CAS read operations to the DRAMs.

Table 1 and Table 2 provide the matrices used to manipulate the incoming memory bus address to provide for proper board select, bank select, and DRAM address generation, for 1-Mbit and 4-Mbit DRAMs, respectively. Additionally, the effects on various configurations on the column address bits involved in the stream buffer fill logic are shown.

There are three methods in which the adaptive look ahead buffer fill cycle optimization balances the memory resources. These are: (1) adjusting the size of the fill based on the mode of interleaving, (2) dynamically adjusting the size of the fill to minimize read latency as seen by the requesting node, and (3) aligning the fill address to the beginning of a page.

The first method uses the interleaving configuration mode of the memory module in the system and from that information determines the number of look ahead locations it should read from memory and store in the buffers 51-54. This is based on Table 1.

For the four-way interleaved module only one fill read is performed. This is because there typically will be three sequential reads (one read to each of the other three modules in the four-way interleaved set) before the next time the process comes back to read the data that ideally will already be resident in the stream buffers. This means that there are three transaction periods that are opportunities for a given module to fulfill the look ahead fill read operation, without adding delays to the next read operation in the stream to that module.

In the two-way interleaved case the frequency of reads to a single module by a single process can double from the four-way interleaved case, because a sequential read stream will land on a particular module one out of two instead of one out of four times. Therefore by doubling the number of fills performed for a given memory cycle the number of times the memory must be accessed is equal to the number of times the memory must be accessed for a four-way interleaved module. By the same reasoning that the number of reads is doubled for a two-way board, the number of reads for the one-way interleaved configuration is quadrupled, where all reads in a stream are to a single memory module.

The second mode of optimization is the ability to dynamically change the number of appended fill read cycles depending on the activity on the system bus 11. If a fill transaction is already active on a memory module and a new transaction is initiated by the CPU that is not to the stream buffer being filled, then the control logic 45 will truncate the fill operation at the end of the current memory cycle although some location(s) within the stream buffer may not have been filled yet. This allows the new transaction to proceed without incurring the additional delays of completing the entire fill operation.

The third mode of operation is where the fill controller will align the address of the last location to be read with the last location available to do page mode reads to the DRAMs. In detail, the fill controller will avoid generating a fill operation that would cross an address boundary corresponding to the size of the maximum fill operation (e.g., four blocks if one-way interleaved). Instead, the fill controller will only perform fills that end at the appropriate address boundary for the given interleave mode. Then, when the next stream buffer fill operation is required to refill that stream buffer, the fill controller will perform a fill that starts on the appropriate address boundary and proceeds for the appropriate number of page mode read cycles before completing the fill operation. In this manner, the most efficient page mode read operations are used to refill the stream buffers when required.

Without these methods of optimization the stream buffers 51-54 could have a negative impact on system performance by delaying memory accesses received from the system bus 11 that miss the stream buffers until an ongoing fill is completed. This increase in latency causes the requesting CPU 10 to wait even longer for data to be returned and ties up the system bus 11 so that it is unavailable for other system elements.

The use of these optimization features significantly reduces the potential negative impact to the system performance by balancing the stream buffer maintenance with the resources required by other system elements. This results in faster completion of memory accesses and consequently and improvement of peak memory throughput.

The appended fill operation used in one embodiment of the invention is initiated by a read transaction on the bus 11 to an address that does not match the addresses of existing prefetched data in the stream buffers 51-54. That is, a miss in the stream buffer 15. The address of this read is checked to see if there is an opportunity to perform page mode read cycles. The page mode opportunity is defined as having sequential addresses available to do page mode cycles. Because the memory module supports exchange operations a unique definition of the address bits is used as shown in Tables 1 and 2. Without this definition support for exchange operations and page mode DRAM operations are mutually exclusive. Referring to FIG. 10, the address from bus 11 for this read is applied to the DRAMs via multiplexer 86, and the read operation proceeds, accessing memory 12 using RAS and CAS generated by address strobe generator 86a, resulting in data being sent back to CPU in the usual manner for a read. If page mode read locations are available then the memory control 86b of FIG. 10 (part of controller 45) is notified and makes provisions to append page mode read operations to the end. That is, before RAS is brought high (deasserted), new column addresses will be sent to the memory via input 86c to the multiplexer 86, and the generator 86a will apply another CAS for each new column address. The address is incremented to the next location by logic 86d and provided to the DRAM address mux 86 where it is available when the normal read operation concludes. The controller 86b selects the normal address or the page mode append address by output 86e to the multiplexer.

Thus, when the normal read operation concludes, the controller selects the appended page mode read address and blocks the negation of the RAS strobe to the DRAMs, thus keeping the DRAM active for accessing any column of the addressed row without a new RAS cycle. The CAS strobe is negated normally, but then after the appended page mode read access has been driven out to the DRAMs via multiplexer 86, the generator 86a reasserts CAS which reads the next sequential location which is selected by the appended page mode address. The address is then incremented to point to the next sequential location. This operation of providing an address and cycling CAS is repeated until all of the available page mode locations have been read.

The appended fill cycle operation functions to allow for the attaching of sequential memory access to the end of an existing memory access, thus prefetching memory data from the next sequential location. Because this access is appended to an existing DRAM read operation the data from the next sequential location can be retrieved and stored in the faster access buffer 15 before the current transaction on the bus 11 is completed. Thus the read latency is now a function of the bus protocol and not the DRAM read access time, allowing the bus 11 to run at its peak bandwidth. Without using this append operation, in order to read the sequential locations the controller 14 would have to initiate individual DRAM read operations for each location. If this were the case the sequence to read sequential locations would require that the DRAM operation terminate normally, wait for the minimum precharge time between DRAM accesses (as specified for the DRAM devices) then initiate a new DRAM read operation. In the time needed to perform two individual DRAM accesses, the appended read can perform four read accesses, since the page mode access time is much less than RAS-CAS access time, and the precharge part of the cycle time is not imposed for each page mode cycle.

Figure 11:
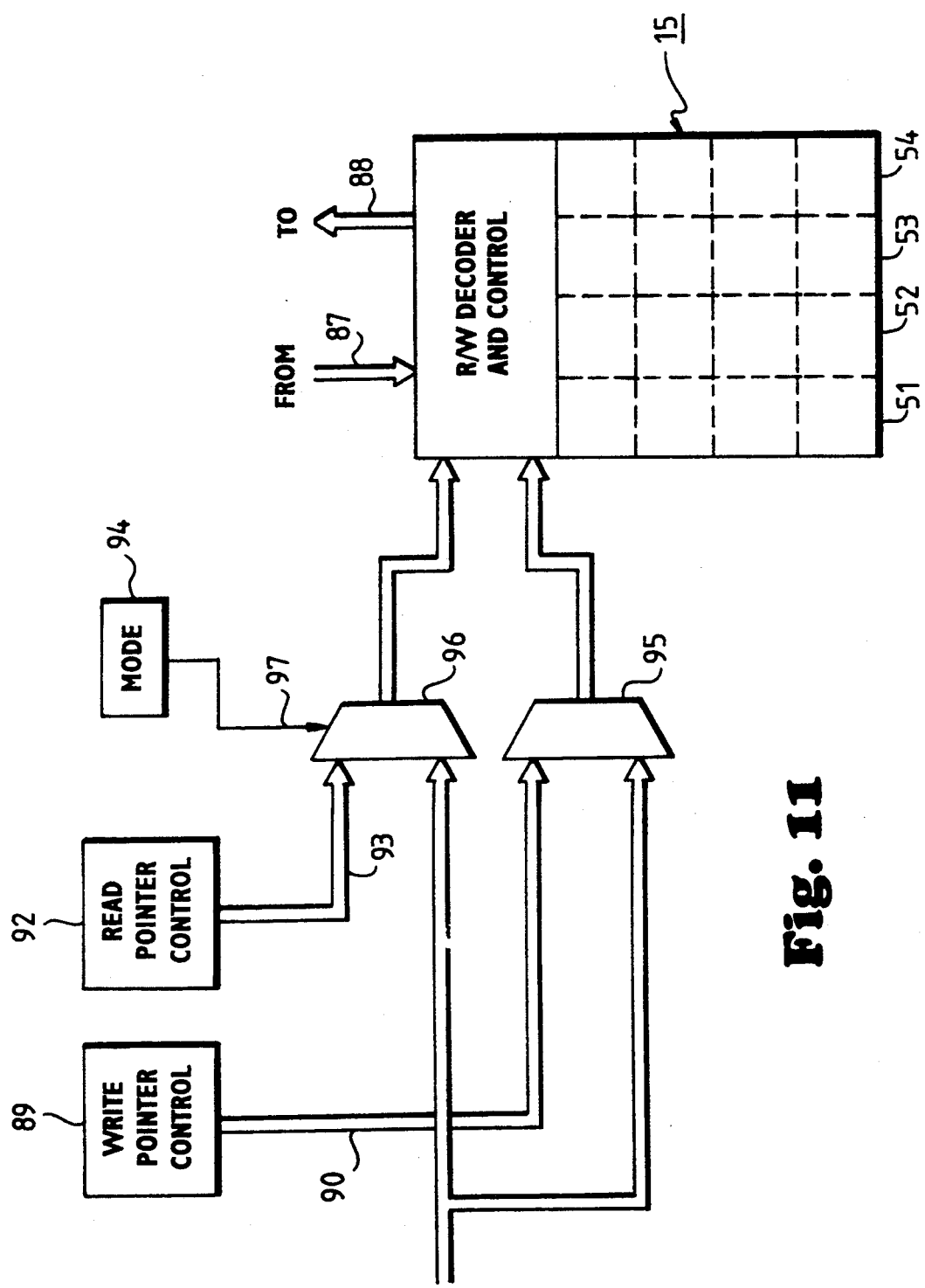
FIG. 11 is an electrical diagram in block form of the stream buffer used in the module of FIG. 3, according to one embodiment.

Referring to FIG. 11, the stream buffer 15 is constructed as a high-speed RAM, used to store data read from the slower memory 12. A dual-port configuration is used, having a separate write port 87 and read port 88. The RAM is organized as sixteen locations of 140-bits each. A write pointer control 89 in the controller 45 calculates the location within the RAM that the incoming data read from the memory 12 will be written to, as discussed above, and produces a 4-bit (1-of-16) selection on lines 90, referred to as the write pointer. The write pointer on lines 90 is applied to a decoder in the read/write control 91 for the RAM to select one of the sixteen locations (four buffers 51–54 with four entries per buffer). A read pointer control 92 in the controller 45 calculates the location within the RAM that the data read will be read from and supplied to the CPU 10, and produces a 4-bit (1-of-16) selection on lines 93, referred to as the read pointer. This read pointer on lines 93 is applied to the read/write control 91 for the RAM to select one of the sixteen locations.

During normal operation of the stream buffer, neither the read or write pointers on lines 90 and 93 have a fixed relationship to the physical address sent from the CPU 10. This makes addressing the RAM buffer 15 for testing a difficult or impossible chore. According to a feature of the invention, a test mode of operation provides a direct-address or fixed relationship between the memory read and write command addresses and the read and write pointers, thus simplifying diagnostic testing of the system. A mode control bit 94 is included in the controller 45, implemented by a flip-flop, and this mode control is set or reset by a command written to the memory controller 14 from the CPU 10. When this status bit 94 is in the "1" state, the system is in the direct read/write mode (test mode) so that addresses sent from the CPU 10 to the controller 14 will directly select one of the sixteen locations of the read buffer 15. When the bit is in the "0" state, direct read/write is disabled (normal mode of operation is employed). When direct read/write is enabled, all memory read and write operations are directed to the stream buffer 15 (not to the memory 12) so that all write data is written directly into the stream buffer memory 15 and read data is always obtained from the stream buffer 15. Multiplexers 95 and 96 are placed between the write and read pointer controls 89 and 92 and the read/write port control 91. One set of inputs to the multiplexers are the lines 90 and 93 (for normal operation), while the other set of inputs receive the address bits directly from the bus 11 (via latch 21). The multiplexers are selected by an output line 97 from the mode bit 94. In operation, for a test mode, the mode bit 94 is written with a "1" by the CPU 10, placing the buffer 15 in the direct read/write mode. All subsequent write commands issued by the host computer CPU 10 cause the write data issued by the CPU 10 to be stored directly into the stream buffer 15 at the location specified by the four address bits taken from the address issued by the CPU 10 (other address bits are ignored), passed through the multiplexer 95 and applied to the read/write control 91 of the RAM 15. All subsequent read commands issued by CPU 10 cause the same four address bits to be taken from the CPU 10 address on bus 11, passed through the multiplexer 96, and applied to the control 91 from the RAM, where it is used to select 1-of-16 RAM locations. Data thus accessed in the RAM is sent to the CPU 10 as read data.

Ideally, for greatest flexibility in use, it is desirable to use the low-order address bits to select locations within the stream buffer 15. However, in order to accommodate interleaved operation of system memory modules in memory 12, and still maintain a coherent direct addressing scheme for the stream buffer memory, it is necessary to use different bits from the system memory address on bus 11 for different interleaving schemes. As low-order address bits are typically used to select different memory modules while in a two-way or four-way interleaving mode, the address bits chosen from the system memory address on bus 11 must be shifted "higher" one or two bit positions before being applied to the decoding logic. By correctly choosing address bits, the appropriate stream buffer location can be selected while still respecting the differing interleaving schemes. In particular, for one-way interleaving (i.e., no interleaving) the address bits <6:3> from the bus 11 are used to select the locations of the buffer 15 as follows:

| Memory Address Bits | | | | |
|---|---|---|---|---|
| <6> | <5> | <4> | <3> | Stream Buffer Entry Selected |
| 0 | 0 | 0 | 0 | Buffer-0, Entry-0 (Head) |
| 0 | 0 | 0 | 1 | Buffer-0, Entry-1 |
| 0 | 0 | 1 | 0 | Buffer-0, Entry-2 |
| 0 | 0 | 1 | 1 | Buffer-0, Entry-3 (Tail) |
| 0 | 1 | 0 | 0 | Buffer-1, Entry-0 (Head) |
| 0 | 1 | 0 | 1 | Buffer-1, Entry-1 |
| 0 | 1 | 1 | 0 | Buffer-1, Entry-2 |
| 0 | 1 | 1 | 1 | Buffer-1, Entry-3 (Tail) |
| 1 | 0 | 0 | 0 | Buffer-2, Entry-0 (Head) |
| 1 | 0 | 0 | 1 | Buffer-2, Entry-1 |
| 1 | 0 | 1 | 0 | Buffer-2, Entry-2 |
| 1 | 0 | 1 | 1 | Buffer-2, Entry-3 (Tail) |
| 1 | 1 | 0 | 0 | Buffer-3, Entry-0 (Head) |
| 1 | 1 | 0 | 1 | Buffer-3, Entry-1 |
| 1 | 1 | 1 | 0 | Buffer-3, Entry-2 |
| 1 | 1 | 1 | 1 | Buffer-3, Entry-3 (Tail) |

For two-way interleaving, the address bits are decoded in the same way, except address bits <7:4> are used from the bus 11 instead of <6:3>. In like manner, for four-way interleaved memory modules, the address bits used from bus 11 are <8:5>, but the decoding is otherwise the same as in the table just given.

Complete diagnostic coverage of the memory elements used within the stream buffer 15 are thus obtained, using normal memory read and write protocols provided by the CPU 10 via the memory interconnect bus 11. Additionally, isolation of errors is greatly improved because testing of the stream buffer 15 can be decoupled from functional usage of the device. Without this direct read/write feature of the invention, the testing of such a memory element would be more time consuming, and isolation of some failure would not be possible.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

TABLE 1

Addressing Matrix For Modules Using 1 MBit DRAMS

| LOGICAL SIGNAL | INTERLEAVE FACTOR WITH 2 BANKS | | | INTERLEAVE FACTOR WITH 4 BANKS | | |
|---|---|---|---|---|---|---|
| | 1-WAY | 2-WAY | 4-WAY | 1-WAY | 2-WAY | 4-WAY |
| ROW BIT 0 | CAD 5 | CAD 5 | CAD 5 | CAD 5 | CAD 5 | CAD 5 |
| ROW BIT 1 | CAD 6 | CAD 6 | CAD 6 | CAD 6 | CAD 6 | CAD 6 |
| ROW BIT 2 | CAD 7 | CAD 7 | CAD 7 | CAD 7 | CAD 7 | CAD 7 |
| ROW BIT 3 | CAD 8 | CAD 8 | CAD 8 | CAD 8 | CAD 8 | CAD 8 |
| ROW BIT 4 | CAD 9 | CAD 9 | CAD 9 | CAD 9 | CAD 9 | CAD 9 |
| ROW BIT 5 | CAD 10 | CAD 10 | CAD 10 | CAD 10 | CAD 10 | CAD 10 |
| ROW BIT 6 | CAD 11 | CAD 11 | CAD 11 | CAD 11 | CAD 11 | CAD 11 |
| ROW BIT 7 | CAD 12 | CAD 12 | CAD 12 | CAD 12 | CAD 12 | CAD 12 |
| ROW BIT 8 | CAD 13 | CAD 13 | CAD 13 | CAD 13 | CAD 13 | CAD 13 |
| ROW BIT 9 | N/A | N/A | N/A | N/A | N/A | N/A |
| RW COL BIT 0 | CAD 3 | CAD 22 | CAD 22 | CAD 3 | CAD 23 | CAD 23 |
| RW COL BIT 1 | CAD 4 | CAD 4 | CAD 23 | CAD 4 | CAD 4 | CAD 24 |
| RW COL BIT 2 | CAD 15 | CAD 15 | CAD 15 | CAD 15 | CAD 15 | CAD 15 |
| RW COL BIT 3 | CAD 18 | CAD 18 | CAD 18 | CAD 18 | CAD 18 | CAD 18 |
| RW COL BIT 4 | CAD 19 | CAD 19 | CAD 19 | CAD 19 | CAD 19 | CAD 19 |
| RW COL BIT 5 | CAD 20 | CAD 20 | CAD 20 | CAD 20 | CAD 20 | CAD 20 |
| RW COL BIT 6 | CAD 21 | CAD 21 | CAD 21 | CAD 21 | CAD 21 | CAD 21 |
| RW COL BIT 7 | CAD 14 | CAD 14 | CAD 14 | CAD 14 | CAD 14 | CAD 14 |
| RW COL BIT 8 | CAD 17 | CAD 17 | CAD 17 | CAD 22 | CAD 22 | CAD 22 |
| RW COL BIT 9 | N/A | N/A | N/A | N/A | N/A | N/A |
| RW BANK SEL BIT 0 | CAD 16 | CAD 16 | CAD 16 | CAD 16 | CAD 16 | CAD 16 |
| RW BANK SEL BIT 1 | N/A | N/A | N/A | CAD 17 | CAD 17 | CAD 17 |
| RW BOARD SEL BIT 0 | CAD 22 | CAD 3 | CAD 3 | CAD 23 | CAD 3 | CAD 3 |
| RW BOARD SEL BIT 1 | CAD 23 | CAD 23 | CAD 4 | CAD 24 | CAD 24 | CAD 4 |
| RW BOARD SEL BIT 2 | CAD 24 | CAD 24 | CAD 24 | CAD 25 | CAD 25 | CAD 25 |
| RW BOARD SEL BIT 3 | CAD 25 | CAD 26 | CAD 25 | CAD 26 | CAD 26 | CAD 26 |
| RW BOARD SEL BIT 4 | CAD 26 | CAD 26 | CAD 26 | CAD 27 | CAD 27 | CAD 27 |
| RW BOARD SEL BIT 5 | CAD 27 | CAD 27 | CAD 27 | CAD 28 | CAD 28 | CAD 28 |
| RW BOARD SEL BIT 6 | CAD 28 | CAD 28 | CAD 28 | CAD 29 | CAD 29 | CAD 29 |
| RW BOARD SEL BIT 7 | CAD 29 | CAD 29 | CAD 29 | CAD 30 | CAD 30 | CAD 30 |
| RW BOARD SEL BIT 8 | CAD 30 | CAD 30 | CAD 30 | N/A | N/A | N/A |
| EX COL BIT 0 | CAD 3 | CAD 72 | CAD 72 | CAD 3 | CAD 73 | CAD 73 |
| EX COL BIT 1 | CAD 4 | CAD 4 | CAD 73 | CAD 4 | CAD 4 | CAD 74 |
| EX COL BIT 2 | CAD 15 | CAD 15 | CAD 15 | CAD 15 | CAD 16 | CAD 15 |
| EX COL BIT 3 | CAD 68 | CAD 68 | CAD 68 | CAD 68 | CAD 68 | CAD 68 |
| EX COL BIT 4 | CAD 69 | CAD 69 | CAD 69 | CAD 69 | CAD 69 | CAD 69 |
| EX COL BIT 5 | CAD 70 | CAD 70 | CAD 70 | CAD 70 | CAD 70 | CAD 70 |
| EX COL BIT 6 | CAD 71 | CAD 71 | CAD 71 | CAD 71 | CAD 71 | CAD 71 |
| EX COL BIT 7 | CAD 14 | CAD 14 | CAD 14 | CAD 14 | CAD 14 | CAD 14 |
| EX COL BIT 8 | CAD 67 | CAD 67 | CAD 67 | CAD 72 | CAD 72 | CAD 72 |
| EX COL BIT 9 | N/A | N/A | N/A | N/A | N/A | N/A |
| EX BANK SEL BIT 0 | CAD 66 | CAD 66 | CAD 66 | CAD 66 | CAD 66 | CAD 66 |
| EX BANK SEL BIT 1 | N/A | N/A | N/A | CAD 67 | CAD 67 | CAD 67 |
| EX BOARD SEL BIT 0 | CAD 72 | CAD 3 | CAD 3 | CAD 73 | CAD 3 | CAD 3 |
| EX BOARD SEL SIT 1 | CAD 73 | CAD 73 | CAD 4 | CAD 74 | CAD 74 | CAD 4 |
| EX BOARD SEL BIT 2 | CAD 74 | CAD 74 | CAD 74 | CAD 75 | CAD 75 | CAD 75 |
| EX BOARD SEL BIT 3 | CAD 75 | CAD 75 | CAD 75 | CAD 76 | CAD 76 | CAD 76 |
| EX BOARD SEL BIT 4 | CAD 76 | CAD 76 | CAD 76 | CAD 77 | CAD 77 | CAD 77 |
| EX BOARD SEL BIT 5 | CAD 77 | CAD 77 | CAD 77 | CAD 78 | CAD 78 | CAD 78 |
| EX BOARD SEL BIT 6 | CAD 78 | CAD 78 | CAD 78 | CAD 79 | CAD 79 | CAD 79 |
| EX BOARD SEL BIT 7 | CAD 79 | CAD 79 | CAD 79 | CAD 80 | CAD 80 | CAD 80 |
| EX BOARD SEL BIT 8 | CAD 80 | CAD 80 | CAD 80 | N/A | N/A | N/A |

TABLE 2

Addressing Matrix For Modules Using 4 MBit DRAMS

| LOGICAL SIGNAL | INTERLEAVE FACTOR WITH 2 BANKS | | | INTERLEAVE FACTOR WITH 4 BANKS | | |
|---|---|---|---|---|---|---|
| | 1-WAY | 2-WAY | 4-WAY | 1-WAY | 2-WAY | 4-WAY |
| ROW BIT 0 | CAD 5 | CAD 5 | CAD 5 | CAD 5 | CAD 5 | CAD 5 |
| ROW BIT 1 | CAD 6 | CAD 6 | CAD 6 | CAD 6 | CAD 6 | CAD 6 |
| ROW BIT 2 | CAD 7 | CAD 7 | CAD 7 | CAD 7 | CAD 7 | CAD 7 |

TABLE 2-continued

Addressing Matrix For Modules Using 4 MBit DRAMS

| LOGICAL SIGNAL | INTERLEAVE FACTOR WITH 2 BANKS | | | INTERLEAVE FACTOR WITH 4 BANKS | | |
|---|---|---|---|---|---|---|
| | 1-WAY | 2-WAY | 4-WAY | 1-WAY | 2-WAY | 4-WAY |
| ROW BIT 3 | CAD 8 | CAD 8 | CAD 8 | CAD 8 | CAD 8 | CAD 8 |
| ROW BIT 4 | CAD 9 | CAD 9 | CAD 9 | CAD 9 | CAD 9 | CAD 9 |
| ROW BIT 5 | CAD 10 | CAD 10 | CAD 10 | CAD 10 | CAD 10 | CAD 10 |
| ROW BIT 6 | CAD 11 | CAD 11 | CAD 11 | CAD 11 | CAD 11 | CAD 11 |
| ROW BIT 7 | CAD 12 | CAD 12 | CAD 12 | CAD 12 | CAD 12 | CAD 12 |
| ROW BIT 8 | CAD 13 | CAD 13 | CAD 13 | CAD 13 | CAD 13 | CAD 13 |
| ROW BIT 9 | CAD 14 | CAD 14 | CAD 14 | CAD 14 | CAD 14 | CAD 14 |
| RW COL BIT 0 | CAD 3 | CAD 24 | CAD 24 | CAD 3 | CAD 25 | CAD 25 |
| RW COL BIT 1 | CAD 4 | CAD 4 | CAD 25 | CAD 4 | CAD 4 | CAD 26 |
| RW COL BIT 2 | CAD 15 | CAD 15 | CAD 15 | CAD 15 | CAD 15 | CAD 15 |
| RW COL BIT 3 | CAD 18 | CAD 18 | CAD 18 | CAD 18 | CAD 18 | CAD 18 |
| RW COL BIT 4 | CAD 19 | CAD 19 | CAD 19 | CAD 19 | CAD 19 | CAD 19 |
| RW COL BIT 5 | CAD 20 | CAD 20 | CAD 20 | CAD 20 | CAD 20 | CAD 20 |
| RW COL BIT 6 | CAD 21 | CAD 21 | CAD 21 | CAD 21 | CAD 21 | CAD 21 |
| RW COL BIT 7 | CAD 22 | CAD 22 | CAD 22 | CAD 22 | CAD 22 | CAD 22 |
| RW COL BIT 8 | CAD 17 | CAD 17 | CAD 17 | CAD 24 | CAD 24 | CAD 24 |
| RW COL BIT 9 | CAD 23 | CAD 23 | CAD 23 | CAD 23 | CAD 23 | CAD 23 |
| RW BANK SEL BIT 0 | CAD 16 | CAD 16 | CAD 16 | CAD 16 | CAD 16 | CAD 16 |
| RW BANK SEL BIT 1 | N/A | N/A | N/A | CAD 17 | CAD 17 | CAD 17 |
| RW BOARD SEL BIT 0 | CAD 24 | CAD 3 | CAD 3 | CAD 25 | CAD 3 | CAD 3 |
| RW BOARD SEL BIT 1 | CAD 25 | CAD 25 | CAD 4 | CAD 26 | CAD 26 | CAD 4 |
| RW BOARD SEL BIT 2 | CAD 26 | CAD 26 | CAD 26 | CAD 27 | CAD 27 | CAD 27 |
| RW BOARD SEL BIT 3 | CAD 27 | CAD 27 | CAD 27 | CAD 28 | CAD 28 | CAD 28 |
| RW BOARD SEL BIT 4 | CAD 28 | CAD 28 | CAD 28 | CAD 29 | CAD 29 | CAD 29 |
| RW BOARD SEL BIT 5 | CAD 29 | CAD 29 | CAD 29 | CAD 30 | CAD 30 | CAD 30 |
| RW BOARD SEL BIT 6 | CAD 30 | CAD 30 | CAD 30 | N/A | N/A | N/A |
| RW BOARD SEL BIT 7 | N/A | N/A | N/A | N/A | N/A | N/A |
| RW BOARD SEL BIT 8 | N/A | N/A | N/A | N/A | N/A | N/A |
| EX COL BIT 0 | CAD 3 | CAD 74 | CAD 74 | CAD 3 | CAD 75 | CAD 75 |
| EX COL BIT 1 | CAD 4 | CAD 4 | CAD 75 | CAD 4 | CAD 4 | CAD 76 |
| EX COL BIT 2 | CAD 15 | CAD 15 | CAD 15 | CAD 15 | CAD 15 | CAD 15 |
| EX COL BIT 3 | CAD 68 | CAD 68 | CAD 68 | CAD 68 | CAD 68 | CAD 68 |
| EX COL BIT 4 | CAD 69 | CAD 69 | CAD 69 | CAD 69 | CAD 69 | CAD 69 |
| EX COL BIT 5 | CAD 70 | CAD 70 | CAD 70 | CAD 70 | CAD 70 | CAD 70 |
| EX COL BIT 6 | CAD 71 | CAD 71 | CAD 71 | CAD 71 | CAD 71 | CAD 71 |
| EX COL BIT 7 | CAD 72 | CAD 72 | CAD 72 | CAD 72 | CAD 72 | CAD 72 |
| EX COL BIT 8 | CAD 67 | CAD 67 | CAD 67 | CAD 74 | CAD 74 | CAD 74 |
| EX COL BIT 9 | CAD 73 | CAD 73 | CAD 73 | CAD 73 | CAD 73 | CAD 73 |
| EX BANK SEL BIT 0 | CAD 66 | CAD 66 | CAD 66 | CAD 66 | CAD 66 | CAD 66 |
| EX BANK SEL BIT 1 | N/A | N/A | N/A | CAD 67 | CAD 67 | CAD 67 |
| EX BOARD SEL BIT 0 | CAD 74 | CAD 3 | CAD 3 | CAD 75 | CAD 3 | CAD 3 |
| EX BOARD SEL BIT 1 | CAD 75 | CAD 75 | CAD 4 | CAD 76 | CAD 76 | CAD 4 |
| EX BOARD SEL BIT 2 | CAD 76 | CAD 76 | CAD 76 | CAD 77 | CAD 77 | CAD 77 |
| EX BOARD SEL BIT 3 | CAD 77 | CAD 77 | CAD 77 | CAD 78 | CAD 78 | CAD 78 |
| EX BOARD SEL BIT 4 | CAD 78 | CAD 78 | CAD 78 | CAD 79 | CAD 79 | CAD 79 |
| EX BOARD SEL BIT 5 | CAD 79 | CAD 79 | CAD 79 | CAD 80 | CAD 80 | CAD 80 |
| EX BOARD SEL BIT 6 | CAD 80 | CAD 80 | CAD 80 | N/A | N/A | N/A |
| EX BOARD SEL BIT 7 | N/A | N/A | N/A | N/A | N/A | N/A |
| EX BOARD SEL BIT 8 | N/A | N/A | N/A | N/A | N/A | N/A |

What is claimed is:

1. A method of operating a stream buffer coupled between a central processor unit (CPU) and a memory, comprising the steps of:

selecting between a normal operation mode and a test operation mode and dynamically switching between said normal operation mode and said test mode in various stages of system operation;

performing the following steps during said normal operation mode:

(1) upon receiving a memory write request from said CPU, writing data received from said CPU into said memory at a location indicated by said write request; and (2) upon receiving a memory read request from said CPU, performing the following steps:

(A) determining whether the requested data resides in said stream buffer, and if so at what location therein;

(B) if the requested data is determined to reside in said stream buffer, accessing said stream buffer at the determined location and returning the data contained therein to said CPU; and (C) if the requested data is determined not to reside in said stream buffer, performing the following steps:

(i) accessing said memory at an address indicated by said read request and returning the data contained therein to said CPU; and (ii) accessing said memory at an address sequentially following the address indicated by said read request and writing the data contained therein to said stream buffer at an allocated location thereof; and performing the following steps during said test operation mode:

(1) upon receiving a memory write request from said CPU, writing data received from said CPU into said stream buffer at a location indicated by said write request without regard to which location of said stream buffer would be allocated if said normal operation mode were presently selected; and (2) upon receiving a memory read request from said CPU, accessing said stream buffer at an address indicated by said read request and returning the data contained therein to said CPU without regard to either (a) whether said stream buffer would be determined to hold the requested data or (b) the location in said stream buffer that would be determined to hold the requested data if said normal operation mode were presently selected.

2. A method according to claim 1, wherein said determining step comprises the steps of:

comparing a memory address accompanying said read request with the memory addresses of data blocks stored in said stream buffer;

determining whether any of the comparisons result in a match, such a result indicating that the requested data resides in said stream buffer; and determining, based on which comparison resulted in a match, the location in said stream buffer at which the requested data resides.

3. A method according to claim 1, further comprising the step of:

incrementing an allocation pointer after data is written to said stream buffer from said memory during said normal operation mode, the value of said allocation pointer indicating which location in said stream buffer is allocated to receive memory data upon a subsequent read request for which the request data is determined not to reside in said stream buffer.

4. A method according to claim 1, further comprising the step of:

continually determining during said normal operation mode which location in said stream buffer has least recently been used to satisfy a CPU read request, the determined least-recently used location being taken as the location in said stream buffer that is allocated to receive memory data upon a read request for which the request data is determined not to reside in said stream buffer.

* * * * *